United States Patent
Lai et al.

(10) Patent No.: US 7,250,332 B2
(45) Date of Patent: Jul. 31, 2007

(54) METHOD FOR FABRICATING A SEMICONDUCTOR DEVICE HAVING IMPROVED HOT CARRIER IMMUNITY ABILITY

(75) Inventors: Wen-Koi Lai, Tai-Chung Hsien (TW); Tung-Hsing Lee, Hsin-Chu (TW); Tai-Yuan Lee, Taipei (TW); Yu-Lung Chin, Tainan Hsien (TW); Yi-Chia Lee, Taipei Hsien (TW); Shyh-Fann Ting, Kao-Hsiung Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 315 days.

(21) Appl. No.: 10/711,038

(22) Filed: Aug. 19, 2004

(65) Prior Publication Data

US 2006/0040448 A1 Feb. 23, 2006

(51) Int. Cl.
*H01L 21/8238* (2006.01)

(52) U.S. Cl. .............. 438/231; 438/230; 257/E21.633

(58) Field of Classification Search ............... 438/230, 438/231; 257/E21.632, E21.633
See application file for complete search history.

(56) References Cited

U.S. PATENT DOCUMENTS 6,255,152 B1 * 7/2001 Chen ..................... 438/199
6,900,088 B2 * 5/2005 Nanjo et al. ............ 438/210

* cited by examiner

*Primary Examiner*—Bradley K. Smith
(74) *Attorney, Agent, or Firm*—Winston Hsu

(57) ABSTRACT

The present invention discloses a method for fabricating a semiconductor device. A substrate is provided. At least one first and second gate structure, having sidewalls, are included on a surface of the substrate. A first ion implantation process is performed to form a shallow-junction doping region of a first conductive type in the substrate next to each of the sidewalls of the first gate structure, followed by the formation of offset spacers on each of the sidewalls of the first and second gate structure. A second ion implantation process is performed to form a shallow-junction doping region of a second conductive type in the substrate next to the offset spacer on each of the sidewalls of the second gate structure.

14 Claims, 11 Drawing Sheets

METHOD FOR FABRICATING A SEMICONDUCTOR DEVICE HAVING IMPROVED HOT CARRIER IMMUNITY ABILITY

BACKGROUND OF INVENTION

1. Field of the Invention

The present invention generally relates to a semiconductor process, and more particularly, to a method for fabricating a semiconductor device having ultra-shallow source/drain extensions and improved hot carrier immunity ability.

2. Description of the Prior Art

In order to fulfill the requirements of continued device scaling down, it is always very important to utilize low thermal budget processes when fabricating deep submicron devices. Low thermal budget processes result in thinner doping regions in metal-oxide-semiconductor (MOS) transistor devices, which is proved of great benefit to prevent the MOS transistor devices from short channel effect. In the MOS transistor devices, a P-type metal-oxide-semiconductor (PMOS) transistor device tends to have a more severe short channel problem than an N-type metal-oxide-semiconductor (NMOS) transistor device because P-type dopants exercise more quickly than N-type dopants. By properly controlling the depth and profile of the source/drain (S/D) extension, the short channel phenomenon is effectively inhibited.

Please refer to FIG. 1 to FIG. 4. FIG. 1 to FIG. 4 are schematic diagrams of forming a semiconductor device 10 having ultra-shallow S/D extensions according to the prior art. As shown in FIG. 1, a semiconductor substrate 11 is provided first. The substrate 11 is a P-type substrate, and the substrate has two N wells 13, 15. A plurality of gate structures 12, 14, 16, 18 are included on a surface of the semiconductor substrate 11. Each of the gate structures 12, 14, 16, 18 comprises a polysilicon gate 22 and a gate dielectric layer 24 interposed between the polysilicon gate 22 and the substrate 11. In addition, each of the gate structures 12, 14, 16, 18 having sidewalls 26.

First, a dielectric layer (not shown) is formed on the substrate 11 to cover the gate structures 12, 14, 16, 18. Then, a dry etching process is performed to vertically remove the dielectric layer (not shown) down to the surface of the substrate 11. An offset spacer 28 is thus formed on each of the sidewalls 26 of the gate structures 12, 14, 16, 18. Actually, the gate structures 12, 14, 16, 18 are surrounded by the offset spacers 28 if this figure is shown in a three-dimensional form.

Since the gate structure 12 is a gate of an input/output (I/O) PMOS (not shown) and the gate structure 14 is a gate of an I/O NMOS (not shown), two I/O extension implantations are necessarily performed to them. As shown in FIG. 2, an N-type I/O extension implantation process is performed, by utilizing a photo mask (not shown) and the gate structure 14 as a mask, to form an N-type S/D extension 32 in the substrate 11 next to each of the offset spacers 28 on each of the sidewalls 26 of the gate structure 14. After that, a P-type I/O extension implantation process is performed, by utilizing a photo mask (not shown) and the gate structure 12 as a mask, to form a P-type S/D extension 34 in N well 13 next to each of the offset spacers 28 on each of the sidewalls 26 of the gate structure 12. Because both the N-type S/D extension 32 and the P-type S/D extension 34 are very shallow, they are very helpful in preventing the I/O PMOS (not shown) and the I/O NMOS (not shown) from short channel phenomenon.

Since the gate structure 16 is a gate of a core PMOS (not shown) and the gate structure 18 is a gate of a core NMOS (not shown), two other implantations are necessarily performed to them to form lightly doped drains. As shown in FIG. 3, a first N-type ion implantation process is thereafter performed, by utilizing a photo mask (not shown) and the gate structure 18 as a mask, to form an N-type lightly doped region 36 in the substrate 11 next to the offset spacer 28 at either side of the gate structure 18. Then, a first P-type ion implantation process is performed, by utilizing a photo mask (not shown) and the gate structure 16 as a mask, to form a P-type lightly doped region 38 in the N well 15 next to the offset spacer 28 at either side of the gate structure 16.

In addition, at least one angled ion implantation process is performed to form an N-type pocket doping region 42 in the N well 13 at either side of the gate structure 12, a P-type pocket doping region 44 in the substrate 11 at either side of the gate structure 14, an N-type pocket doping region 46 in the N well 15 at either side of the gate structure 16, and a P-type pocket doping region 48 in the substrate 11 at either side of the gate structure 18. The P-type pocket doping regions 44, 48 and the N-type pocket doping regions 42, 46 are used for preventing MOS devices from punch-through phenomenon. Later, a silicon nitride layer 52 is formed on the surface of the substrate 11 to cover the gate structures 12, 14, 16, 18 and the offset spacers 28 on each of the sidewalls 26 of the gate structures 12, 14, 16, 18.

As shown in FIG. 4, an etching process is performed to vertically remove the silicon nitride layer 52 down to the surface of the substrate 11 so as to form a spacer 54 at sides of the gate structures 12, 14, 16, 18. Actually, the gate structures 12, 14, 16, 18 are surrounded by the spacers 54 if this figure is shown in a three-dimensional form. After that, at least one N-type ion implantation process and at least one P-type ion implantation process are performed. As a result, a P-type source/drain region 56 in the N well 13 next to the spacer 54 at either side of the gate structure 12, an N-type source/drain region 58 is the substrate 11 at either side of the gate structure 14, a P-type source/drain region 62 in the N well 15 at either side of the gate structure 16, and an N-type source/drain region 64 in the substrate 11 at either side of the gate structure 18 are formed. Finally, a rapid thermal process (RTP) is performed to drive-in all of the dopants so that the fabrication of the I/O PMOS 66, the I/O NMOS 68, the core PMOS 72, and the core NMOS 74 is completed.

Although the prior method can fabricate a semiconductor device having ultra-shallow S/D extensions to improve it's short channel performance. However, a new problem emerges. When the P-type S/D extension 34 is very shallow, the N-type S/D extension 32 is even shallower. With such a shallow N-type S/D extension 32, the junction depletion region also tends to be narrow. Therefore, the electric field across the junction depletion region is very high since the electric field across the junction depletion region inversely varies with the depletion region width, i.e. the shallower the N-type S/D extension is, the higher the electric field across the junction depletion region is. Therefore, the hot carrier immunity ability of the I/O NMOS, which needs a high voltage to conduct and is conducted owing to the movements of electrons, is obviously degraded to cause problems.

Therefore, it is very important to develop a new process for fabricating the semiconductor device having ultra-shallow S/D extensions. The method should not only fabricate the semiconductor device having well-controlled ultra-shallow S/D extension profiles, but also should fabricate the semiconductor device having improved hot carrier immunity ability.

SUMMARY OF INVENTION

It is therefore a primary object of the present invention to provide a process for fabricating a semiconductor device having ultra-shallow source/drain extensions and improved hot carrier immunity ability to resolve the abovementioned problem.

According to the claimed invention, a method for fabricating a semiconductor device is provided. A substrate is provided. At least one first gate structure and at least one second gate structure are included on a surface of the substrate. Both the first gate structure and the second gate structure have sidewalls. A first ion implantation process is performed to form a shallow-junction doping region of a first conductive type in the substrate next to each of the sidewalls of the first gate structure. Offset spacers are then formed on each of the sidewalls of the first gate structure and the second gate structure. A second ion implantation process is performed to form a shallow-junction doping region of a second conductive type in the substrate next to the offset spacer on each of the sidewalls of the second gate structure.

Since the present invention method for forming the semiconductor device having ultra-shallow S/D extensions performs the N-type I/O extension implantation process before the offset spacers are formed. Heat energy is provided to the N-type S/D extension to anneal the N-type S/D extension when forming the offset spacers. Not only is the electric field across the junction depletion region effectively reduced because the step for forming the offset spacers is also used as an additional thermal anneal step, leading to improved hot carrier immunity ability of the I/O NMOS. But also no extra thermal anneal step is required. In addition, the performance of other transistor devices including the I/O PMOSs, the core PMOSs, and the core NMOSs are not affected at all when implanting the present invention.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
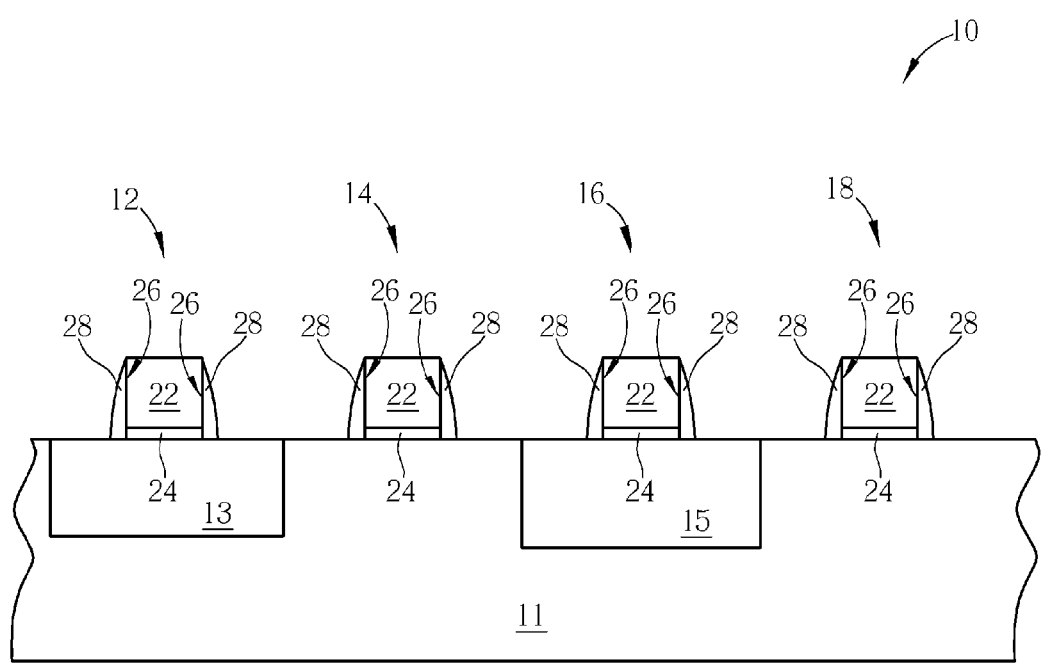
FIG. 1 to FIG. 4 are schematic diagrams of forming a semiconductor device having ultra-shallow S/D extensions according to the prior art.
Figure 2:
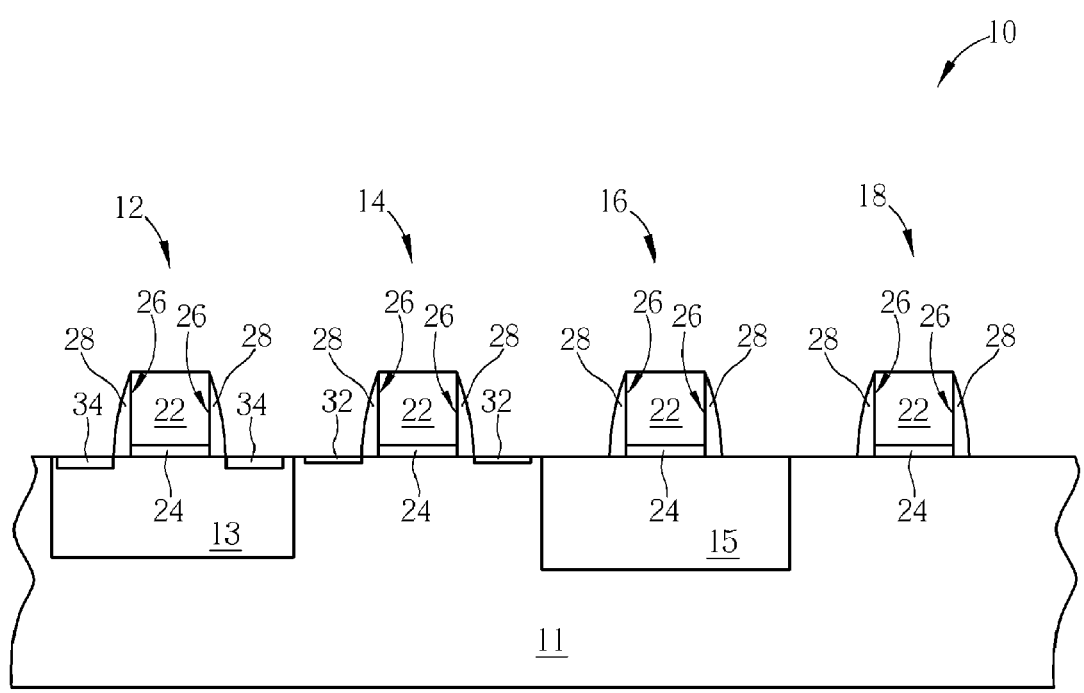
Figure 3:
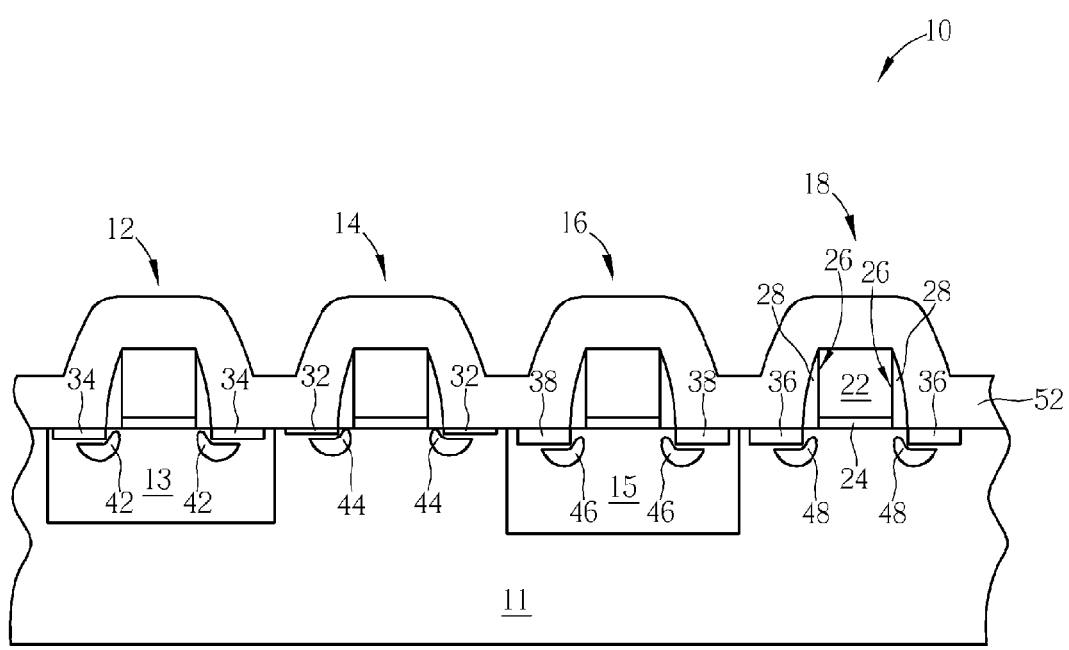
Figure 4:
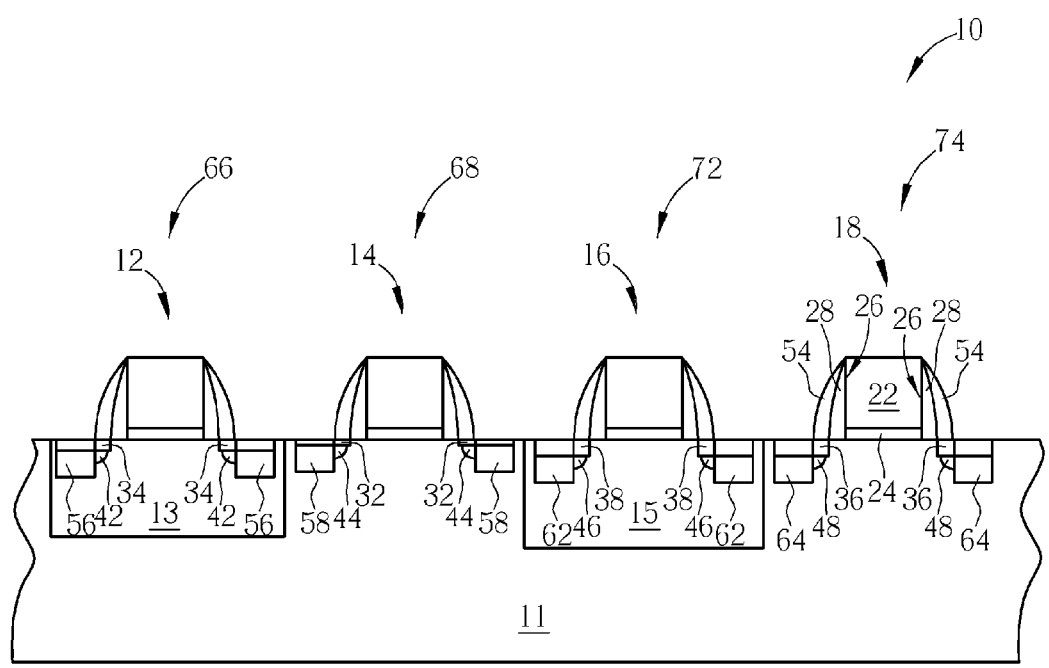
Figure 5:
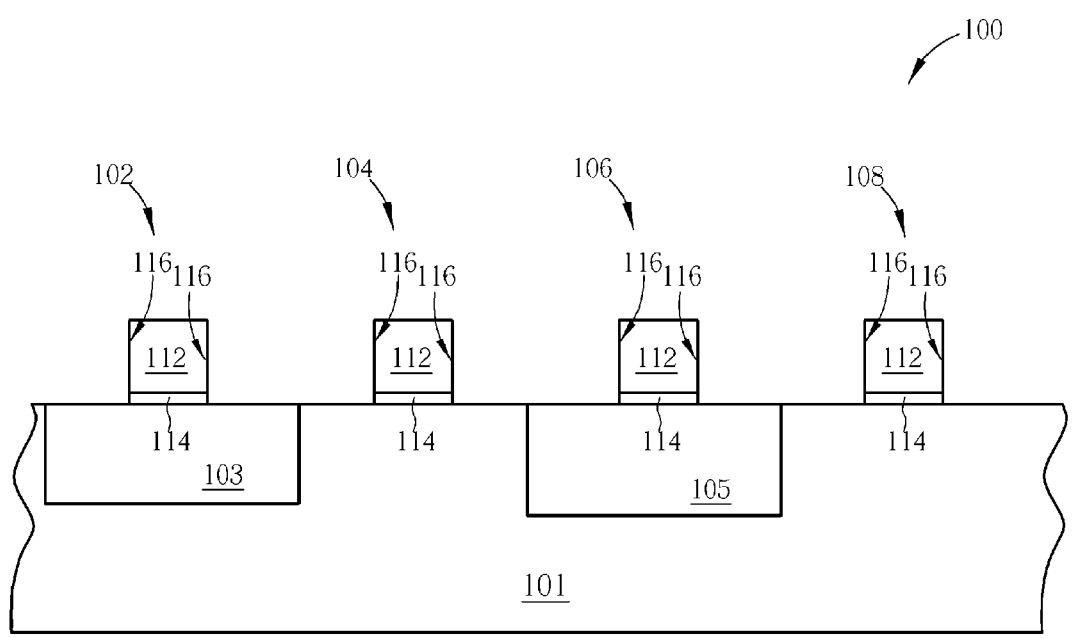
FIG. 5 to FIG. 9 are schematic diagrams of forming a semiconductor device having ultra-shallow S/D extensions according to the present invention.

Please refer to FIG. 5 to FIG. 9. FIG. 5 to FIG. 9 are schematic diagrams of forming a semiconductor device 100 having ultra-shallow S/D extensions according to the present invention. As shown in FIG. 5, a semiconductor substrate 101 is provided first. The substrate 101 is a P-type substrate, and the substrate 101 has two N wells 103, 105. The semiconductor substrate 101 comprises a silicon substrate or a silicon-on-insulator substrate. A plurality of gate structures 102, 104, 106, 108 are included on a surface of the semiconductor substrate 101. Each of the gate structures 102, 104, 106, 108 comprises a polysilicon gate 112 and a gate dielectric layer 114 interposed between the polysilicon gate 112 and the substrate 101. In addition, each of the gate structures 102, 104, 106, 108 having sidewalls 116.

Figure 6:
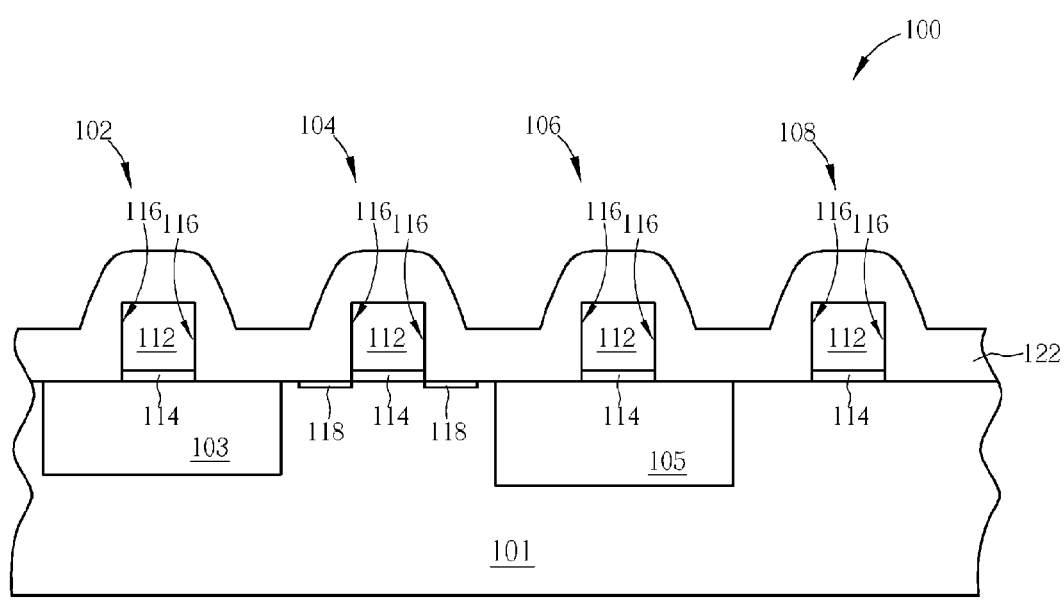

Since the gate structure 102 is a gate of an I/O PMOS (not shown) and the gate structure 104 is a gate of an I/O NMOS (not shown), two I/O extension implantations are necessarily performed to them. But however, an N-type I/O extension implantation process is performed first according to the present invention. As shown in FIG. 6, the N-type I/O extension implantation process is performed, by utilizing a photo mask (not shown) and the gate structure 104 as a mask, to form an N-type S/D extension 118 in the substrate 101 next to each of the sidewalls 116 of the gate structure 104. A dopant of the N-type I/O extension implantation process comprises phosphorous or arsenic. Then, a dielectric layer 122 is formed on the substrate 101 to cover the gate structures 102, 104, 106, 108.

Figure 7:
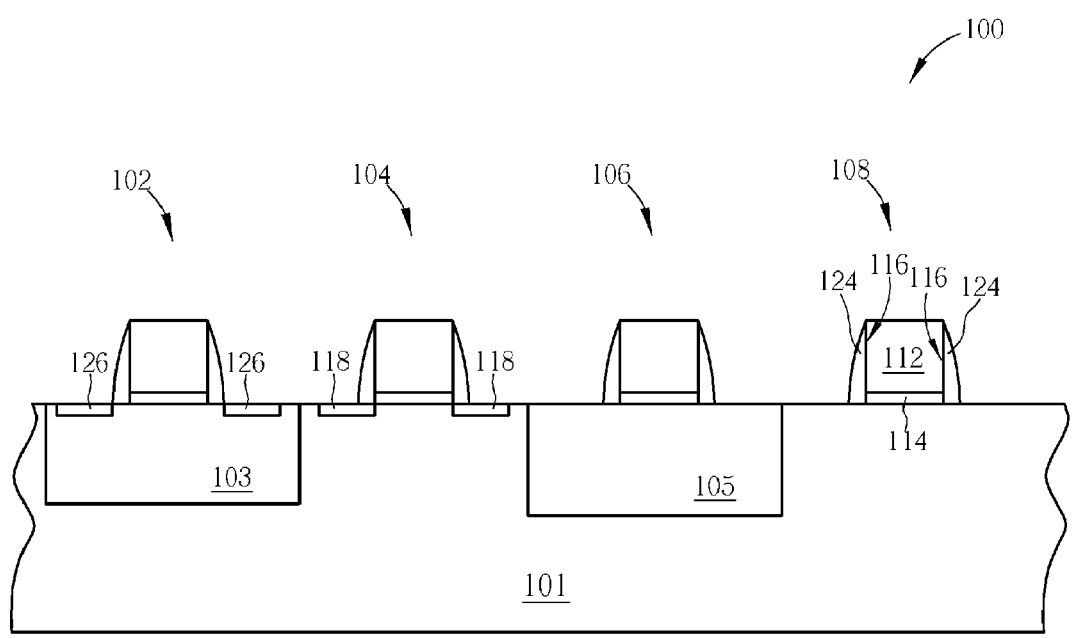

After that, a dry etching process is performed to vertically remove the dielectric layer 122 down to the surface of the substrate 101, as shown in FIG. 7. An offset spacer 124 is thus formed on each of the sidewalls 116 of the gate structures 102, 104, 106, 108. Actually, the gate structures 102, 104, 106, 108 are surrounded by the offset spacers 124 if this figure is shown in a three-dimensional form. A P-type I/O extension implantation process is thereafter performed, by utilizing a photo mask (not shown) and the gate structure 102 as a mask, to form a P-type S/D extension 126 in the N well 103 next to each of the offset spacers 122 on each of the sidewalls 116 of the gate structure 102. A dopant of the P-type I/O implantation process is boron.

Because both the N-type S/D extension 118 and the P-type S/D extension 126 are very shallow, they are very helpful in preventing the I/O PMOS (not shown) and the I/O NMOS (not shown) from short channel phenomenon. In addition, the dielectric layer 122 is a tetraethyl-ortho-silicate (TEOS) oxide layer formed by a low temperature chemical vapor deposition (LPCVD) process at a temperature ranging from 650° C. to 680° C. A thickness of the dielectric layer 122 ranges from 170 to 210 angstroms (Å). However, the dielectric layer 122 is not limited to the above-mentioned TEOS oxide layer. The dielectric layer 122 can also be an oxide layer, a nitride layer, or an oxynitride layer formed by a LPCVD process at a high reaction temperature. When the dielectric layer 122 is formed, heat energy is provided to the N-type S/D extension 118 to anneal the N-type S/D extension 118. The electric field across the junction depletion region is thus effectively reduced due to the drive-in effect provided by the heat energy. Moreover, the unwanted transient enhanced diffusion (TED) effect due to defects incurred from the N-type I/O extension implantation process is inhibited. The profile of the N-type S/D extension 118 is altered to become a well-controlled doping profile, rather than an abrupt junction.

Figure 8:
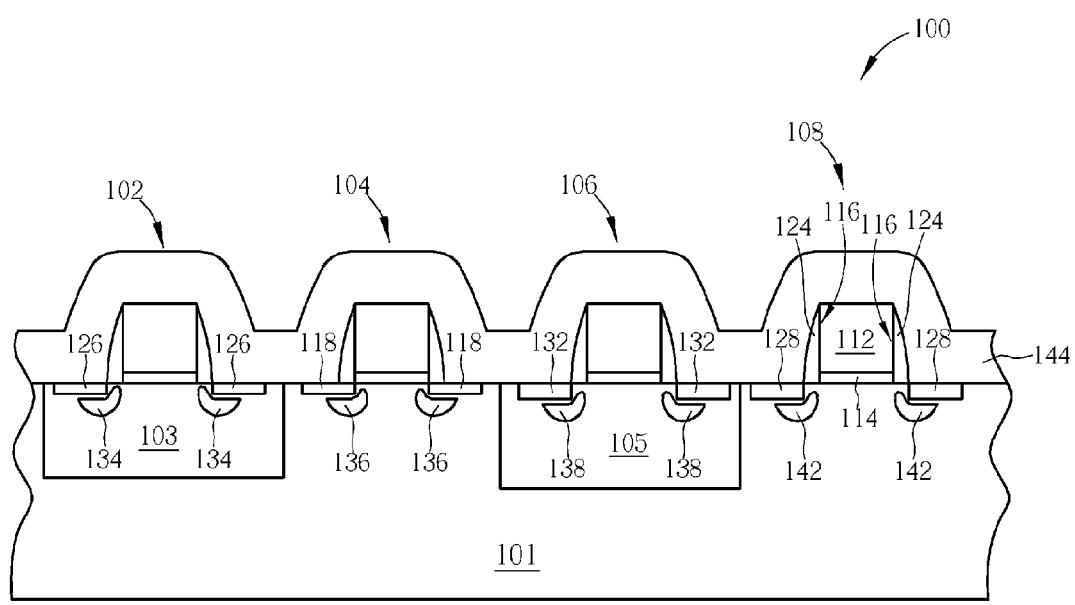

Since the gate structure 106 is a gate of a core PMOS (not shown) and the gate structure 108 is a gate of a core NMOS (not shown), two other implantations are necessarily performed to them to form lightly doped drains. As shown in FIG. 8, a first N-type ion implantation process is thereafter performed, by utilizing a photo mask (not shown) and the gate structure 108 as a mask, to form an N-type lightly doped region 128 in the substrate 101 next to the offset spacer 124 at either side of the gate structure 108. Then, a first P-type ion implantation process is performed, by utilizing a photo mask (not shown) and the gate structure 106 as a mask, to form a P-type lightly doped region 132 in the N well 105 next to the offset spacer 124 at either side of the gate structure 106.

In addition, at least one angled ion implantation process is performed to form an N-type pocket doping region 134 in the N well 103 at either side of the gate structure 102, a P-type pocket doping region 136 is the substrate 101 at either side of the gate structure 104, an N-type pocket doping region 138 in the N well 105 at either side of the gate structure 106, and a P-type pocket doping region 142 in the substrate 101 at either side of the gate structure 108. The P-type pocket doping regions 136, 142 and the N-type pocket doping regions 134, 136 are used for preventing MOS devices from punch-through phenomenon. Later, a silicon nitride layer 144 is formed on the surface of the substrate 101 to cover the gate structures 102, 104, 106, 108, and the offset spacers 122 on each of the sidewalls 116 of the gate structures 102, 104, 106, 108.

It is worth noting that a spacer linear layer (not shown) may be selectively formed on the surface of the substrate 101 to cover the gate structures 102, 104, 106, 108, and the offset spacers 124 on each of the sidewalls 116 of the gate structures 102, 104, 106, 108. The spacer linear layer (not shown) may be formed before forming either of the N-type lightly doped drain 128, the P-type lightly doped region 132, the P-type pocket doping regions 136, 142, and the N-type pocket doping regions 134, 138. The spacer linear layer (not shown) may also be formed after forming all of them and before forming the silicon nitride layer 144.

Figure 9:
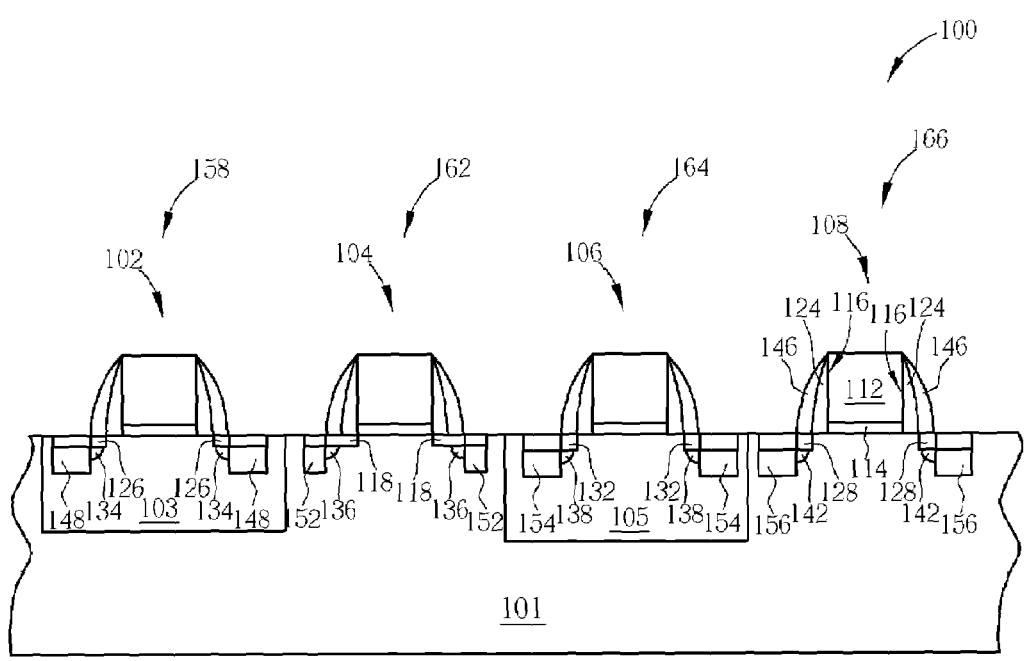

As shown in FIG. 9, an etching process is performed to remove the silicon nitride layer 144 down to the surface of the substrate 101 so as to form a spacer 146 at sides of the gate structures 102, 104, 106, 108. Actually, the gate structures 102, 104, 106, 108 are also surrounded by the spacers 146 if this figure is shown in a three-dimensional form. If the spacer linear layer (not shown) is formed, the spacer linear layer (not shown) on top of each of the gate structures 102, 104, 106, 108 and portions of the spacer linear layer (not shown) on each of the sidewalls 116 of the gate structures 102, 104, 106, 108 are removed when the spacers 146 are formed. Actually, the etching process for forming the spacers 146 stops on the spacer linear layer (not shown) on top of the N-type S/D extension 118, the P-type S/D extension 126, the N-type lightly doped region 128, the P-type lightly doped region 132 under the circumstances.

After that, at least one N-type ion implantation process and at least one P-type ion implantation process are performed. As a result, a P-type source/drain region 148 in the N well 103 next to the spacer 146 at either side of the gate structure 102, an N-type source/drain region 152 in the substrate 101 next to the spacer 146 at either side of the gate structure 104, a P-type source/drain region 154 in the N well 105 next to the spacer 146 at either side of the gate structure 106, and an N-type source/drain region 156 in the substrate 101 next to the spacer 146 at either side of the gate structure 108 are formed. Finally, a rapid thermal process (RTP) is performed to drive-in all of the dopants so that the fabrication of the I/O PMOS 158, the I/O NMOS 162, the core PMOS 164, and the core NMOS 166 is completed.

Figure 10:
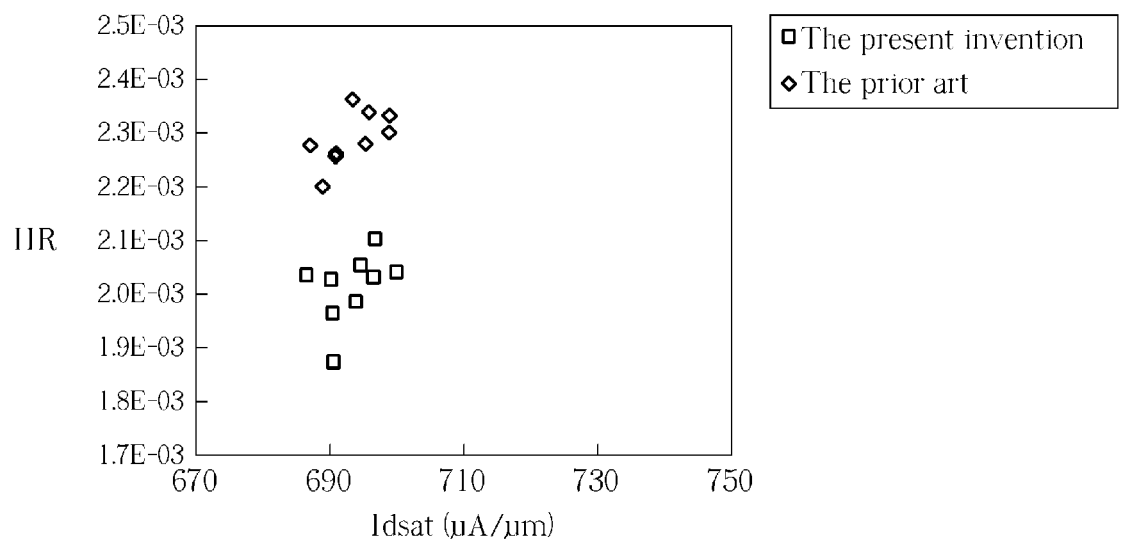
FIG. 10 are impact ionization rate (IIR)-saturation current ($I_{dsat}$) curves.
Figure 11:
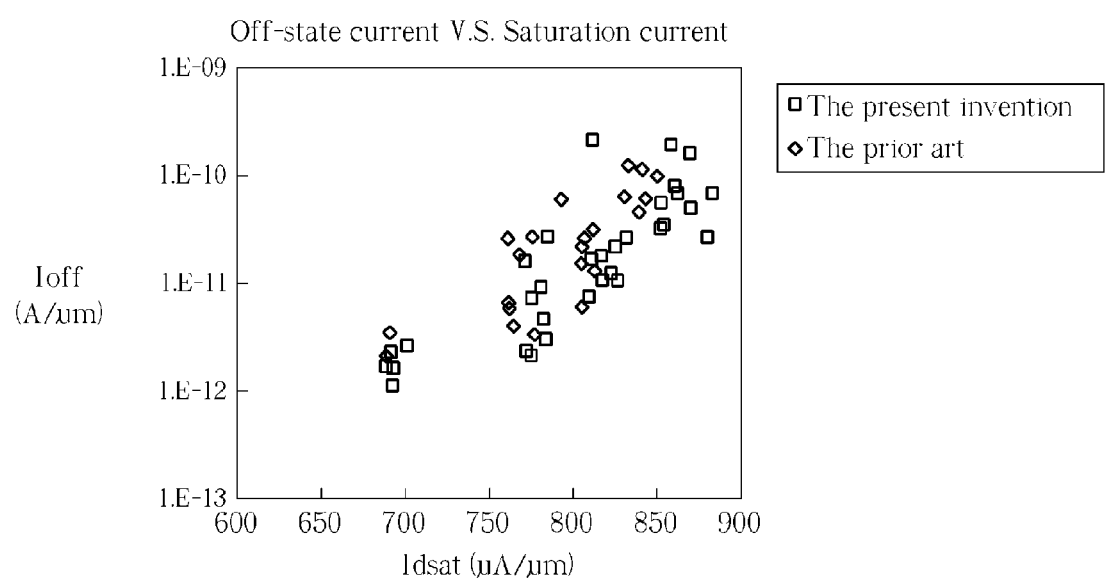
FIG. 11 illustrates off-state current ($I_{off}$)-saturation current ($I_{dsat}$) scattering characteristic.

In order to qualify the semiconductor device 100 having ultra-shallow S/D extensions according to the present invention, two characteristics of the semiconductor device 100 are provided. Please refer to FIG. 10 and FIG. 11, FIG. 10 impact ionization rate (IIR)-saturation current ($I_{dsat}$) curves. FIG. 11 illustrates off-state current ($I_{off}$)-saturation current ($I_{dsat}$) scattering characteristic. Both of the characteristics are acquired based on I/O NMOSs having a threshold voltage of 3.3V and a channel length of 0.4 μm. As shown in FIG. 10, the semiconductor device having ultra-shallow S/D extensions according to the present invention having a much lower IIR than the semiconductor device having ultra-shallow S/D extensions according to the prior art. Since a higher IIR indicates more severe hot carrier effect, the semiconductor device having ultra-shallow S/D extensions according to the present has better hot carrier immunity ability. As shown in FIG. 11, the $I_{off}$-$I_{dsat}$ scattering characteristic of the semiconductor device having ultra-shallow S/D extensions according to the present invention is about the same as the semiconductor device having ultra-shallow S/D extensions according to the prior art.

Since the present invention method for forming the semiconductor device having ultra-shallow S/D extensions performs the N-type I/O extension implantation process before the offset spacers are formed, heat energy is provided to the N-type S/D extension to anneal the N-type S/D extension when forming the offset spacers. As a result, the electric field across the junction depletion region is effectively reduced because the step for forming the offset spacers is used as an additional thermal anneal step to improve the hot carrier immunity ability of the I/O NMOS. When applying the present invention method to a practical production line, semiconductor devices having ultra-shallow S/D extensions and having improved hot carrier immunity ability are fabricated without adding extra thermal anneal step.

Compared to the prior art method, the present invention method for forming the semiconductor device having ultra-shallow S/D extensions performs the N-type I/O extension implantation process before the offset spacers are formed. Heat energy is thus provided to the N-type S/D extension to anneal the N-type S/D extension when forming the offset spacers. Therefore, not only is the electric field across the junction depletion region effectively reduced because the step for forming the offset spacers is used as an additional thermal anneal step, leading to improved hot carrier immunity ability of the I/O NMOS. But also no extra thermal anneal step is required. In addition, the performance of other transistor devices including the I/O PMOSs, the core PMOSs, and the core NMOSs are not affected at all when implanting the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device comprising:
   providing a substrate, at least one first gate structure and at least one second gate structure being included on a surface of the substrate, both the first gate structure and the second gate structure having sidewalls;
   performing a first ion implantation process to form a shallow-junction doping region of a first conductive type in the substrate next to each of the sidewalls of the first gate structure;
   forming offset spacers on each of the sidewalls of the first gate structure and the second gate structure after performing the first ion implantation process; and
   performing a second ion implantation process to form a shallow-junction doping region of a second conductive type in the substrate next to the offset spacer on each of the sidewalls of the second gate structure after forming the offset spacers.

2. The method of claim 1 wherein the substrate comprises a silicon substrate or a silicon-on-insulator substrate.

3. The method of claim 1 wherein both the first gate structure and the second gate structure comprise a polysilicon gate and a gate dielectric layer interposed between the polysilicon gate and the substrate.

4. The method of claim 1 wherein a dopant of the first implantation process comprises phosphorous or arsenic, and the first gate structure is a gate of an input/output (I/O) NMOS.

5. The method of claim 1 wherein the method for forming the offset spacer on each of the sidewalls of the first gate structure and the second gate structure further comprises the following steps:
    forming a dielectric layer on the surface of the substrate to cover the first gate structure and the second gate structure; and
    performing a dry etching process to vertically remove the dielectric layer down to the surface of the substrate.

6. The method of claim 5 wherein the dielectric layer is a tetra-ethyl-ortho-silicate (TEOS) oxide layer formed by a low temperature chemical vapor deposition (LPCVD) process at a temperature ranging from 650° C. to 680° C.

7. The method of claim 6 wherein a thickness of the TEOS oxide layer ranges from 170 to 210 angstroms (Å).

8. The method of claim 1 wherein a dopant of the second ion implantation process is boron, and the second gate structure is a gate of an input/output (I/O) PMOS.

9. The method of claim 1 wherein at least one third gate structure is included on the surface of the substrate, an offset spacer is simultaneously formed on each sidewall of the third gate structure when forming the offset spacers on each of the sidewalls of the first gate structure and the second gate structure.

10. The method of claim 9 further comprising the following steps after performing the second ion implantation process:
    forming a spacer layer on the surface of the substrate to cover the first gate structure, the second gate structure, the third gate structure, and the offset spacers on each of the sidewalls of the first gate structure, the second gate structure, and the third gate structure; and
    performing an etching process to form a spacer at sides of the first gate structure, the second gate structure, and the third gate structure.

11. The method of claim 9 further comprising at least one third ion implantation process after performing the second ion implantation process to form a lightly doped drain region in the substrate next to the offset spacer on each of the sidewalls of the third gate structure.

12. The method of claim 9 further comprising at least one pocket ion implantation process after performing the second ion implantation process to form a pocket doping region in the substrate at either side of the first gate structure, the second gate structure, and the third gate structure.

13. The method of claim 10 further comprising at least one fourth ion implantation process after performing the etching process to form a source/drain region in the substrate next to the spacer at either side of the first gate structure, the second gate structure, and the third gate structure.

14. The method of claim 1 wherein the step for forming the offset spacers on each of the sidewalls of the first gate structure and the second gate structure is used for improving the hot carrier immunity ability of the semiconductor device.

* * * * *